United States Patent
Do et al.

(10) Patent No.: US 8,802,500 B2
(45) Date of Patent: Aug. 12, 2014

(54) INTEGRATED CIRCUIT PACKAGING SYSTEM WITH LEADS AND METHOD OF MANUFACTURE THEREOF

(75) Inventors: Byung Tai Do, Singapore (SG); Linda Pei Ee Chua, Singapore (SG); Gai Leong Lai, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 198 days.

(21) Appl. No.: 12/944,351

(22) Filed: Nov. 11, 2010

(65) Prior Publication Data
US 2011/0108969 A1    May 12, 2011

Related U.S. Application Data

(60) Provisional application No. 61/260,017, filed on Nov. 11, 2009.

(51) Int. Cl.
*H01L 21/44* (2006.01)
*H01L 21/48* (2006.01)
*H01L 21/50* (2006.01)

(52) U.S. Cl.
USPC .............. 438/123; 438/124; 257/676

(58) Field of Classification Search
None
See application file for complete search history.

(56) References Cited

U.S. PATENT DOCUMENTS

| | | | |
|---|---|---|---|
| 6,229,200 B1 | 5/2001 | McIellan et al. | |
| 6,686,651 B1 | 2/2004 | Foster | |
| 6,774,479 B2 | 8/2004 | Schatzler et al. | |
| 7,132,735 B2 | 11/2006 | Diberardino et al. | |
| 7,217,599 B2 | 5/2007 | Punzalan et al. | |
| 7,413,933 B2 | 8/2008 | Punzalan et al. | |
| 7,808,084 B1 * | 10/2010 | Lee et al. | 257/666 |
| 8,184,453 B1 * | 5/2012 | Kim et al. | 361/813 |
| 8,536,688 B2 * | 9/2013 | Ahn et al. | 257/676 |
| 2008/0006929 A1 | 1/2008 | Punzalan et al. | |
| 2008/0079124 A1 * | 4/2008 | Haga et al. | 257/666 |
| 2009/0283893 A1 | 11/2009 | Do et al. | |

* cited by examiner

*Primary Examiner* — Thien F Tran
(74) *Attorney, Agent, or Firm* — Ishimaru & Associates LLP

(57) ABSTRACT

A method of manufacture of an integrated circuit packaging system includes: providing a die paddle, having paddle projections along a paddle peripheral side; forming a lead terminal having a lead extension with the lead extension extending towards the paddle peripheral side and between the paddle projections; mounting an integrated circuit over the die paddle; connecting the integrated circuit and the lead extension; and forming an encapsulation over the die paddle and covering the integrated circuit and lead extension.

20 Claims, 5 Drawing Sheets

INTEGRATED CIRCUIT PACKAGING SYSTEM WITH LEADS AND METHOD OF MANUFACTURE THEREOF

CROSS-REFERENCE TO RELATED APPLICATION

This application claims the benefit of U.S. Provisional Patent Application Ser. No. 61/260,017 filed Nov. 11, 2009, and the subject matter thereof is incorporated herein by reference thereto.

TECHNICAL FIELD

The present invention relates generally to an integrated circuit packaging system, and more particularly to a system for an integrated circuit packaging system with leads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a die paddle, having paddle projections along a paddle peripheral side; forming a lead terminal having a lead extension with the lead extension extending towards the paddle peripheral side and between the paddle projections; mounting an integrated circuit over the die paddle; connecting the integrated circuit and the lead extension; and forming an encapsulation over the die paddle and covering the integrated circuit and lead extension.

The present invention provides an integrated circuit packaging system, including: a die paddle having paddle projections along a paddle peripheral side; a lead terminal having a lead extension with the lead extension extending towards the paddle peripheral side and between the paddle projections; an integrated circuit mounted over the die paddle and connected to the lead extension; and an encapsulation over the die paddle and covering the integrated circuit and lead extension.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
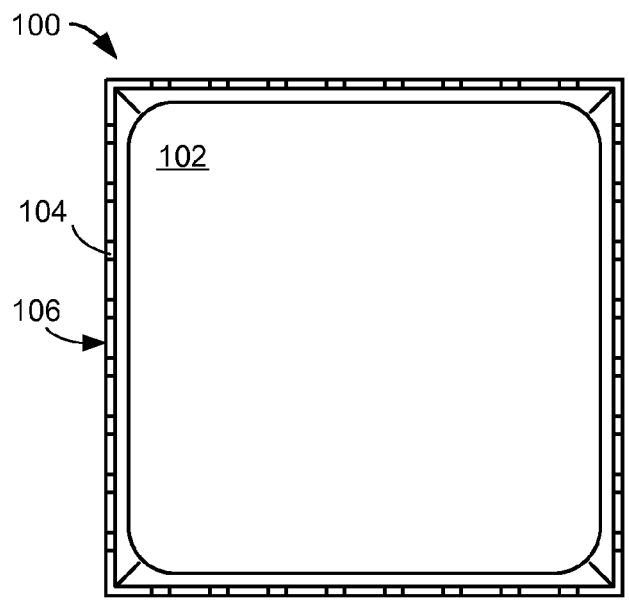
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts an encapsulation 102, which is a cover including an epoxy molding compound. Lead terminals 104, which are a conductive structure made from copper, copper alloys, or other conductive material, can be exposed along an encapsulation perimeter 106 of the encapsulation 102.

For illustrative purposes, the integrated circuit package system 100 is shown with the encapsulation 102 having a square geometric configuration, although it is understood that the encapsulation 102 can have a different geometric configuration. For example, the integrated circuit package system 100 can have the encapsulation 102 with a rectangular geometric configuration.

Figure 2:
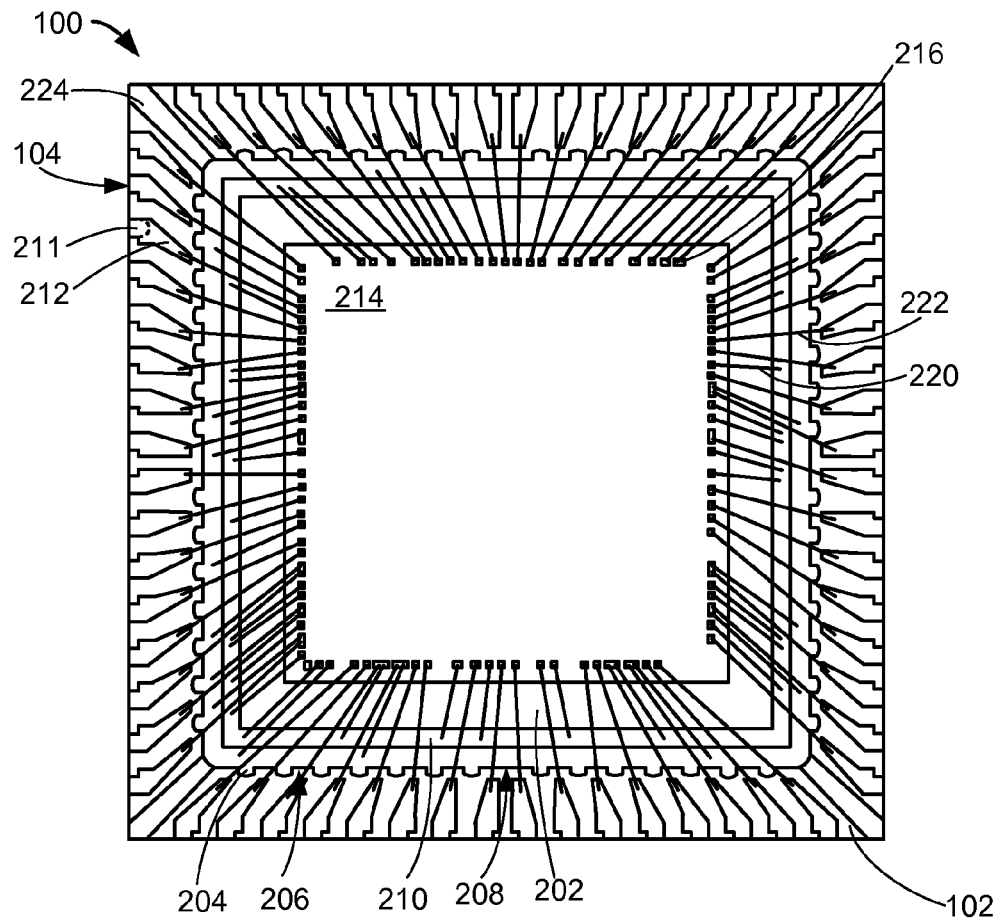
FIG. 2 is a top plan view of the integrated circuit packaging system of FIG. 1 without a top portion of the encapsulation.

Referring now to FIG. 2, therein is shown a top plan view of the integrated packaging system 100 of FIG. 1 without a top portion of the encapsulation 102. The top plan view depicts a die paddle 202, and more specifically a die-attach paddle. The die paddle 202 can have paddle projections 204 and paddle slots 206 along a paddle peripheral side 208 of the die paddle 202. The paddle projections 204 and the paddle slots 206 can be along a perimeter of the die paddle 202. The paddle slots 206 can be between the paddle projections 204.

The die paddle 202 can have a paddle plating 210, which is a conductive plating made out of silver, gold, nickel-palladium alloy, or other conductive materials, over the die paddle 202. The paddle plating 210 can be along the paddle peripheral side 208. The paddle plating 210 can be along all four sides of the die paddle 202. The paddle plating 210 can be optional.

For illustrative purposes, the integrated circuit packaging system 100 is shown with the paddle plating 210 along all four sides of the die paddle 202, although it is understood that the paddle plating 210 can have a different configuration over the die paddle 202. For example, the paddle plating 210 can have a double ring plating configuration over the die paddle 202.

For further illustrative purposes, the integrated circuit packaging system 100 is shown with the paddle plating 210 over the die paddle 202 with the outer region of the die paddle 202 exposed, however, it is understood that the paddle plating 210 can be over the die paddle 202 in a different configuration. For example, the paddle plating 210 can cover the entire outer region of the die paddle 202 along the paddle peripheral side 208.

The lead terminals 104 can be adjacent to the die paddle 202 and can be around the perimeter of the die paddle 202. The lead terminals 104 can include a lead body 211. The lead body 211 can be arranged in an orientation perpendicular to the paddle peripheral side 208.

The lead terminals 104 can include a lead extension 212 extending from an end of the lead body 211, as depicted by the curved dotted line, facing the die paddle 202. The lead extension 212 can extend from the end of the lead terminals 104 towards the paddle peripheral side 208.

An integrated circuit 214, such as an integrated circuit die, a flip chip, can be over a central portion of the die paddle 202. The integrated circuit 214 can have contact pads 216 can be along a peripheral portion of the integrated circuit 214. The paddle plating 210 is a contiguous ring along the paddle peripheral side 208 and around the integrated circuit 214.

First internal interconnects 220, which is a bond wire or ribbon bond wire, can connect the integrated circuit 214 and the die paddle 202. The first internal interconnects 220 can be connected to the contact pads 216 on the integrated circuit 214.

The first internal interconnects 220 can be connected to the die paddle 202 in a number of different ways. For example, the first internal interconnects 220 can be connected to the die paddle 202 with a down bond. In another example, the first internal interconnects 220 can be connected to the die paddle 202 on the paddle plating 210. In a further example, the first internal interconnects 220 can be spot bonded to the exposed portion of the die paddle 202 between the paddle plating 210 and the paddle peripheral side 208.

Second internal interconnects 222, such as a bond wire or ribbon bond wire, can connect between the integrated circuit 214 and the lead extension 212. The second internal interconnects 222 can be connected to the contact pads 216 on the integrated circuit 218.

A tie bar 224, which is a conductive structure made of copper, a copper alloy, other conductive material, or a material similar to the die paddle 202, can be connected to the die paddle 202. The tie bar 224 is connected to at a corner of the die paddle 202 along the paddle peripheral side 208. The tie bar 224 can extend outwardly in a diagonal orientation from the die paddle 202.

FIG. 2 depicts a bar top side of the tie bar 224. A bar bottom side is the side of the tie bar 224 opposite the bar top side.

The tie bar 224 can be half etched along the bar bottom side. Half etching can be achieved through a mechanical or chemical process, such as grinding or chemical etching. The half etched portion of the bar bottom side of the tie bar 224 can be along a portion of the bar bottom side adjacent to the paddle peripheral side 208, along the entire bar bottom side of the tie bar 224, or along any portion of the bar bottom side of the tie bar 224 there between.

The encapsulation 102 of FIG. 1 can be formed over the die paddle 202, the tie bar 224 and the lead terminals 104 and can cover the integrated circuit 214, the first internal interconnects 220, the second internal interconnects 222, the paddle projections 204 and the lead extension 212.

Figure 3:
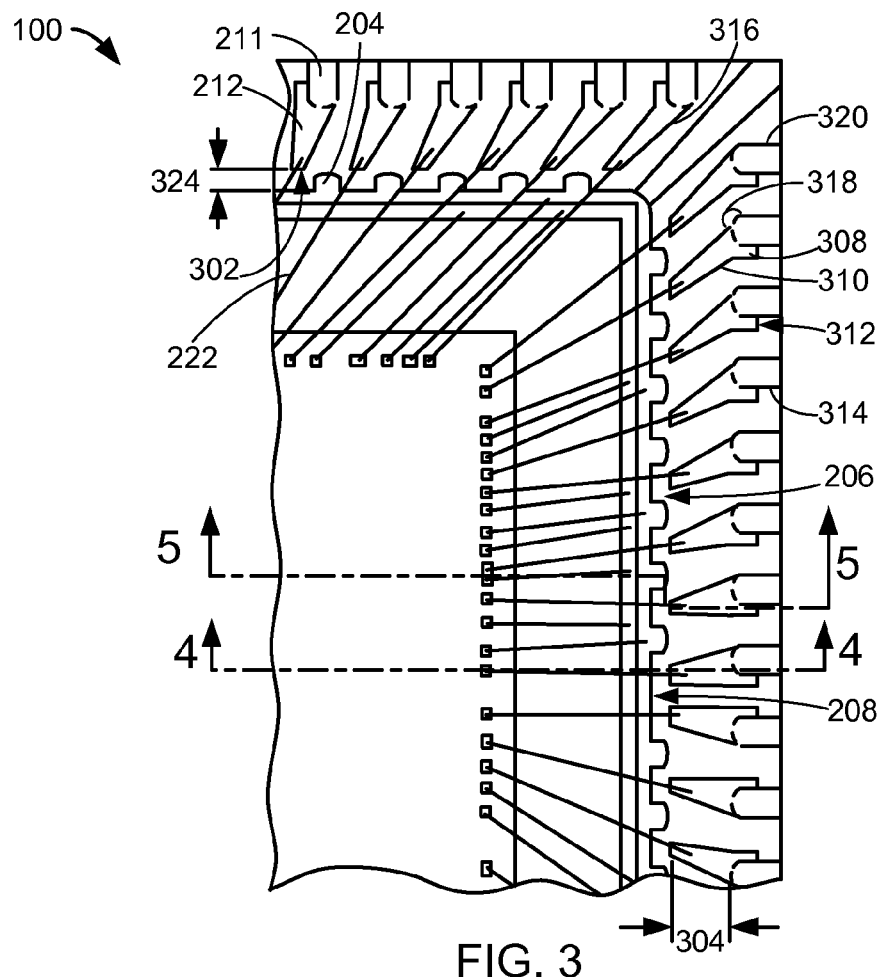
FIG. 3 is a more detailed top plan view of a portion of the integrated circuit packaging system.

Referring now to FIG. 3, therein is shown a more detailed top plan view of a portion of the integrated circuit packaging system 100. The lead extension 212 can include an extension tip 302. The extension tip 302 of the lead extension 212 can be at the end of the lead extension 212 opposite a peripheral portion of the lead body 211.

The lead extension 212 can have an extension length 304 measured as the distance between the extension tip 302 and the end of the lead body 211 adjacent to the die paddle 202. As an example, the extension length 304 can be 0.420 millimeters in length.

The lead extension 212 can have a tapered shape that is wider near the lead body 211 and narrower at the extension tip 302. The lead extension 212 can be narrower at an end of the lead extension 212 adjacent to the paddle peripheral side 208. As an example, the width of the lead extension 212 at the extension tip 302 can be 0.080 millimeters or less.

The lead extension 212 can have an extension tab 308 at an end of the lead extension 212 opposite the extension tip 302 and adjacent to the lead body 211. The extension tab 308 can be along an extension inner side 310 of the lead extension 212. The extension inner side 310 can be the side of the lead extension 212 facing towards the center of the paddle peripheral side 208.

The extension tab 308 can extend from and form a perpendicular edge 312 with a body inner side 314 of the lead body 211. The body inner side 314 can be the side of the lead body 211 facing towards the center of the paddle peripheral side 208.

The extension tab 308 can form a mold interlock feature with the encapsulation 102 of FIG. 1. The mold interlock can function to lock the lead terminals 104 and the lead extension 212 in place and mitigate or eliminate delamination.

The lead extension 212 includes an extension outer side 316 opposite of the extension inner side 310. The extension outer side 316 can be the side of the lead extension 212 facing away from the center of the paddle peripheral side 208.

The extension outer side 316 can have an extension angle 318 relative with a body outer side 320. The body outer side 320 can be opposite the body inner side 314. The body outer side 320 can be the side of the lead body 211 facing away from the center of the paddle peripheral side 208. The body inner side 314 and the body outer side 320 can be equal distant to the paddle peripheral side 208 for the lead body 211 that is at adjacent to the center of the paddle peripheral side 208.

The lead extension 212 near the center of the paddle peripheral side 208 can have the extension angle 318 that is less than the extension angle 318 of the lead extension 212 near a corner of the paddle peripheral side 208. The extension angle 318 for each of the lead extensions 212 is such that the lead extensions 212 point towards the center of the die paddle 202.

The side of the extension tip 302 facing the paddle peripheral side 208 can be parallel with the paddle peripheral side 208 and between two of the paddle projections 204. The paddle projections 204 can be positioned along the paddle peripheral side 208 such that the distance between the paddle projections 204 can accommodate a single one of the extension tip 302.

For example, the distance between the paddle projections 204 can be 0.239 millimeters or less. In another example, the distance between the paddle projections 204 and the extension tip 302 along the extension outer side 316 can be 0.098 millimeters or less. In yet another example, the distance between the paddle projections 204 and the extension tip 302 along the extension inner side 310 can be 0.100 millimeters or less. As an exception, the paddle projections 204 located nearest a center of the paddle peripheral side 208 can be spaced to accommodate two of the extension tip 302.

The integrated circuit packaging system 100 can have a tip gap 324 between the extension tip 302 and the paddle peripheral side 208. As an example, the tip gap 324 can be 0.130 millimeters or less.

It has been discovered that the present invention provides the integrated circuit packaging system 100 having improved reliability, yield and reduced manufacturing cost. The paddle slots 206 and angled lead extensions allows the lead extension 212 to have the extension tip 302 formed closer to the paddle peripheral side 208 and the integrated circuit 214. The extension tip 302 closer to the integrated circuit 214 can allow manufactures to reduce the length of the second internal interconnects 222. The reduced length of the second internal interconnects 222 prevents wire shorting with other interconnects due to wire sweep, thus improving the reliability and yield of the integrated circuit packaging. Furthermore, the reduced length of the second internal interconnects 222 reduces the amount of interconnect material needed by 12-14%, thus reducing manufacturing costs.

It has also been discovered that the present invention provides the integrated circuit packaging system 100 having improved connectivity and yield. The paddle slots 206 enable an increase of the extension length 304. The increase of the extension length 304 can support the wire bond heater block for stitch bonding of the second internal interconnects 222 on the lead extension 212 rather than the lead body 211. This improves the connectivity of the second internal interconnects 222 and reduces the risk of wire pull-out and wire shorting, thereby improving yield.

Figure 4:
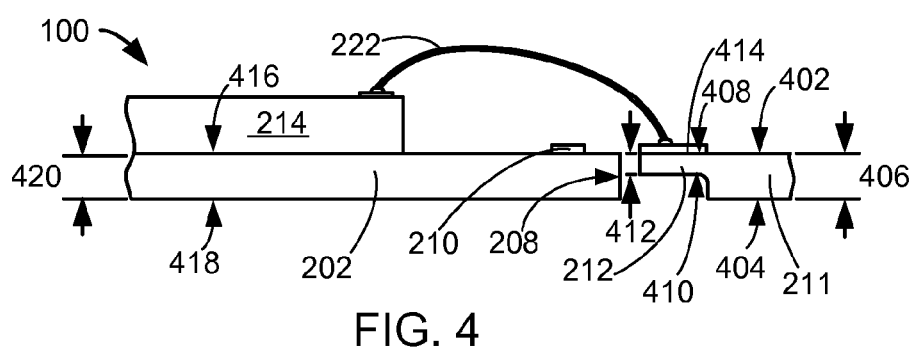
FIG. 4 is a cross-sectional view of the integrated circuit packaging system along line 4-4 of FIG. 3.

Referring now to FIG. 4, therein is shown a cross-sectional view of the integrated circuit packaging system 100 along line 4-4 of FIG. 3. The cross-sectional view depicts the lead body 211 adjacent to the paddle peripheral side 208 of the die paddle 202. The lead body 211 can have a body top side 402 and a body bottom side 404. The lead body 211 can have a body thickness 406 measured as the distance between the body top side 402 and the body bottom side 404.

The lead extension 212 can have an extension top side 408 and an extension bottom side 410. The lead extension 212 can have an extension thickness 412 measured as the distance between the extension top side 408 and the extension bottom side 410. The body thickness 406 can be greater than the extension thickness 412.

The extension top side 408 can be co-planar with the body top side 402. An extension plating 414, which is a conductive plating made out of silver, gold, nickel-palladium alloy, other conductive materials, or a material similar to the paddle plating 210, can be over the extension top side 408. The second internal interconnect 222 can be connected to the extension plating 414.

The extension bottom side 410 can be off-set from the body bottom side 404. The extension bottom side 410 can be formed by a process, such as etching or grinding.

The die paddle 202 can have a paddle top side 416 and a paddle bottom side 418. The die paddle 202 can have a paddle thickness 420 measured as the distance between the paddle top side 416 and the paddle bottom side 418. The paddle plating 210 can be over the paddle top side 416. The integrated circuit 214 can be mounted over the paddle top side 416.

Figure 5:
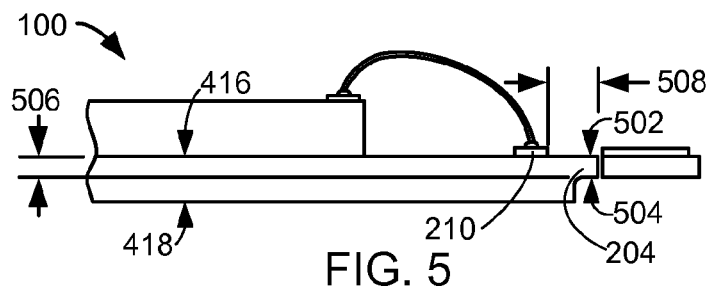
FIG. 5 is a cross-sectional view of the integrated circuit packaging system along line 5-5 of FIG. 3.

Referring now to FIG. 5, therein is shown a cross-sectional view of the integrated circuit packaging system 100 along line 5-5 of FIG. 3. The cross-sectional view depicts the die paddle 202 with the paddle projections 204. The paddle projections 204 can have a projection top side 502 and a projection bottom side 504. The paddle projections 204 can have a projection thickness 506 measured as the distance between the projection top side 502 and the projection bottom side 504. The paddle thickness 420 of FIG. 4 can be greater than the projection thickness 506.

The projection top side 502 can be co-planar with the paddle top side 416. The paddle plating 210 can be over the paddle top side 416 and expose the outer portion of the paddle top side 416 adjacent to the paddle peripheral side 208 by a plating distance 508. The plating distance 508 can be measured as the distance, along the paddle top side 416 and the projection top side 502, between an outer edge of the paddle plating 210 the projection peripheral side. As an example, the plating distance 508 can be 0.250 millimeters.

The projection bottom side 504 can be off-set from the paddle bottom side 418. The projection bottom side 504 can be formed by a process, such as etching or grinding.

Figure 6:
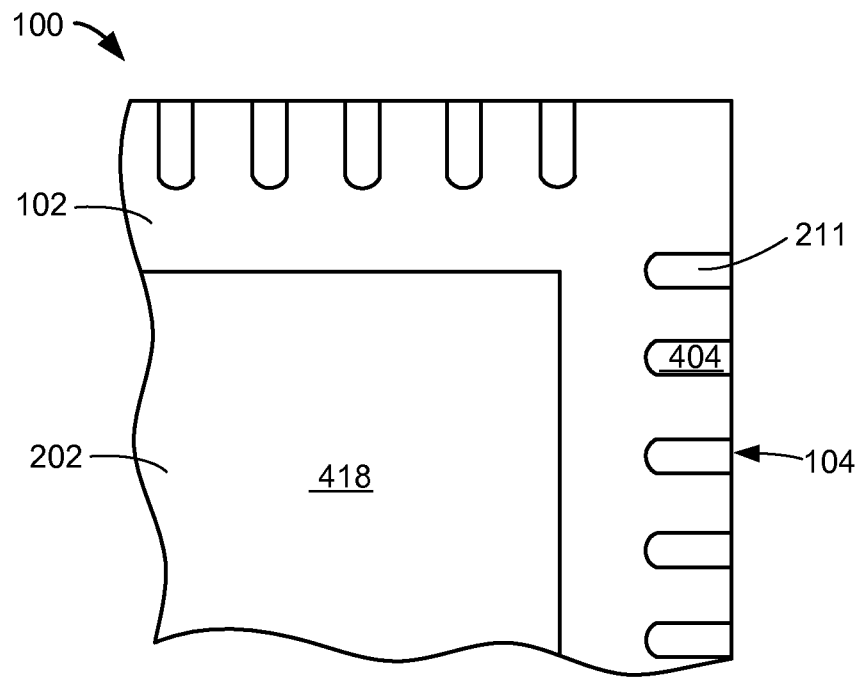
FIG. 6 is a bottom view of a portion of the integrated circuit packaging system.

Referring now to FIG. 6, therein is shown a bottom view of a portion of the integrated circuit packaging system 100. The bottom view depicts the die paddle 202 and the lead terminals 104 exposed from the encapsulation 102. The die paddle 202 can be exposed from the encapsulation 102 along the paddle bottom side 418.

The lead body 211 of the lead terminals 104 can be exposed from the encapsulation 102 along the body bottom side 404. The lead body 211 can be exposed from the encapsulation 102 along the end of the lead body 211 facing away from the die paddle 202.

Figure 7:
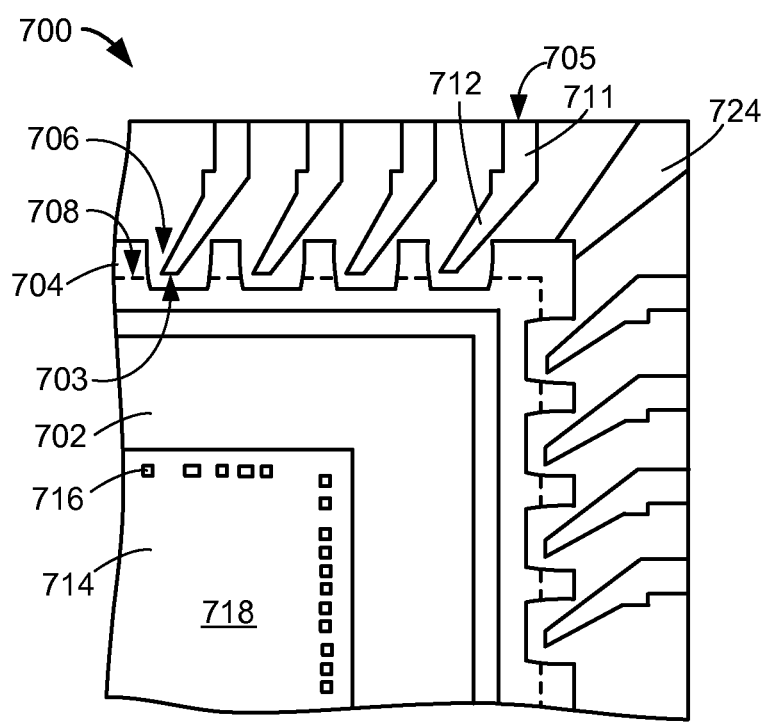
FIG. 7 is a top plan view of a portion of an integrated circuit packaging system, as exemplified by the top plan view in FIG. 3, in a second embodiment of the present invention.

Referring now to FIG. 7, therein is shown a top plan view of a portion of an integrated circuit packaging system 700, as exemplified by the top plan view in FIG. 3, in a second embodiment of the present invention. The integrated circuit packaging system 700 has structural similarities to the integrated circuit packaging system 100 of FIG. 1. For brevity, FIG. 7 highlights some of the differences between the integrated circuit packaging system 100 and the integrated circuit packaging system 700.

The top plan view depicts a die paddle 702, and more specifically a die-attached paddle. The die paddle 702 can have paddle projections 704 and paddle slots 706 along a paddle peripheral side 708. The paddle projections 704 and the paddle slots 706 can be along a perimeter of the die paddle 702.

The paddle slots 706 can be between the paddle projections 704. The paddle slots 706 can extend into the die paddle 702 beyond the paddle peripheral side 708, as depicted by the dashed lines.

Lead terminals 705 can be adjacent to the die paddle 702 and can be around the perimeter of the die paddle 702. The lead terminals 705 can include a lead body 711. The lead body 711 can be arranged in an orientation perpendicular to the paddle peripheral side 708.

The lead terminals 705 can include a lead extension 712 at the end of the lead body 711 facing the die paddle 702. The lead extension 712 can extend from the end of the lead body 711 towards the paddle peripheral side 708.

The lead extension 712 can include an extension tip 703. The extension tip 703 can be at the end of the lead extension 712 opposite the lead terminals 705. The extension tip 703 can be aligned between two of the paddle projections 704 and within the paddle slots 706.

An integrated circuit 714, such as an integrated circuit die, a flip chip, can be over a central portion of the die paddle 702. The integrated circuit 714 can have contact pads 716 along a peripheral portion of the integrated circuit 714.

A tie bar 724, which is a conductive structure made of copper, a copper alloy, other conductive material, or a material similar to the die paddle 702, can be connected to the die paddle 702. The tie bar 724 can be connected to at a corner of the die paddle 702 along the paddle peripheral side 708. The tie bar 724 can extend outwardly in a diagonal orientation from the die paddle 702.

FIG. 7 depicts a bar top side of the tie bar 724. A bar bottom side is the side of the tie bar 724 opposite the bar top side.

The tie bar 724 can be half etched along the bar bottom side. Half etching can be achieved through a mechanical or chemical process, such as grinding or chemical etching. The half etched portion of the bar bottom side of the tie bar 724 can be along a portion of the bar bottom side adjacent to the paddle peripheral side 708, along the entire bar bottom side of the tie bar 724, or along any portion of the bar bottom side of the tie bar 724 there between.

Figure 8:
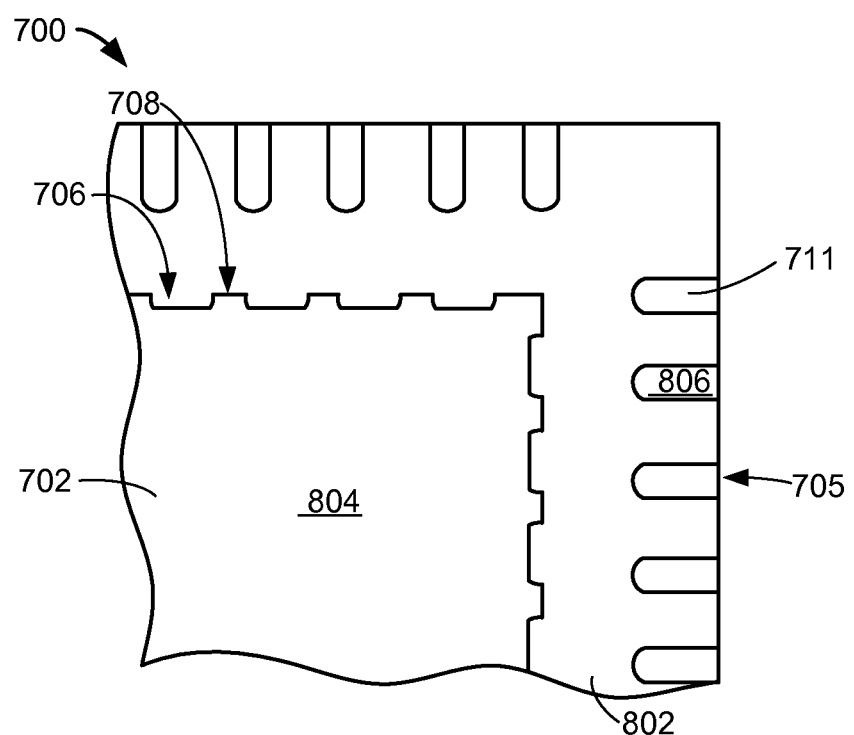
FIG. 8 is a bottom view of a portion of the integrated circuit packaging system.

Referring now to FIG. 8, therein is shown a bottom view of a portion of the integrated circuit packaging system 700. The bottom view depicts the die paddle 702 and the lead terminals 705 exposed from an encapsulation 802. The die paddle 702 can be exposed from the encapsulation 802 along a paddle bottom side 804.

The lead body 711 of the lead terminals 705 can be exposed from the encapsulation 802 along a body bottom side 806. The lead body 711 can be exposed from the encapsulation 802 along the end of the lead body 711 facing away from the die paddle 702.

The paddle slots 706 can be along the paddle peripheral side 708. The paddle slots 706 can extend into the die paddle 702 beyond the paddle peripheral side 708.

Figure 9:
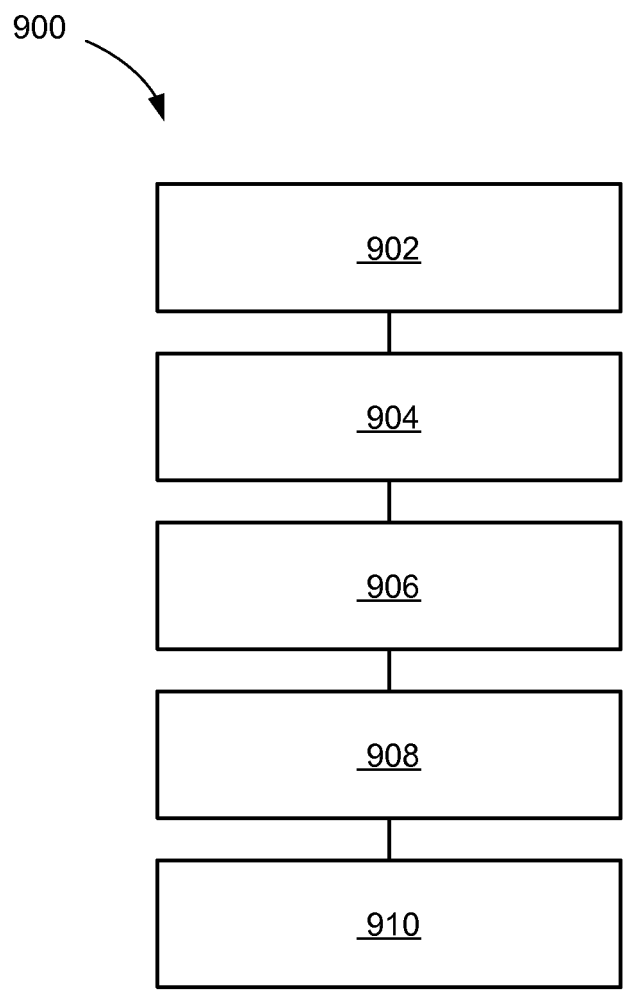
FIG. 9 is a flow chart of a method of manufacture of an integrated circuit packaging system in an embodiment of the present invention.

Referring now to FIG. 9, therein is shown a flow chart of a method 900 of manufacture of an integrated circuit packaging system in an embodiment of the present invention. The method 900 includes: providing a die paddle, having paddle projections along a paddle peripheral side in a block 902; forming a lead terminal having a lead extension with the lead extension extending towards the paddle peripheral side and between the paddle projections in a block 904; mounting an integrated circuit over the die paddle in a block 906; connecting the integrated circuit and the lead extension in a block 908; and forming an encapsulation over the die paddle and covering the integrated circuit and lead extension in a block 910.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a die paddle, having, paddle plating paddle projections along a paddle peripheral side;

forming a lead terminal having a lead extension with the lead extension extending towards the paddle peripheral side and between the paddle projections;
mounting an integrated circuit over the die paddle;
connecting the integrated circuit and the lead extension;
connecting the integrated circuit and the paddle plating, wherein the paddle plating is a contiguous ring along the paddle peripheral side and around the integrated circuit;
forming an encapsulation over the die paddle and covering the integrated circuit and lead extension; and
connecting the die paddle with a tie bar at a corner of the die paddle along the paddle peripheral side, the tie bar extending outwardly in a diagonal orientation from the die paddle.

2. The method as claimed in claim 1 wherein:
providing the die paddle includes providing the die paddle having a paddle slot along the paddle peripheral side and between the paddle projections; and
forming the lead extension includes forming an extension tip of the lead extension in the paddle slot.

3. The method as claimed in claim 1 wherein forming the lead extension includes forming the lead extension having an extension angle, the extension angle near a center of the paddle peripheral side less than a further extension angle for a further lead extension near a corner of the paddle peripheral side.

4. The method as claimed in claim 1 wherein forming the lead extension includes forming the lead extension having a tapered shape, the lead extension narrower at an end adjacent to the paddle peripheral side.

5. The method as claimed in claim 1 wherein forming the lead extension includes forming the lead extension having an extension tip adjacent to the paddle peripheral side and an extension tab at an end of the lead extension opposite the extension tip.

6. A method of manufacture of an integrated circuit packaging system comprising:
providing a die paddle, having a paddle plating and paddle projections along a paddle peripheral side;
forming a lead terminal having a lead body and a lead extension extending from the lead body, the lead extension extending towards the paddle peripheral side and between the paddle projections;
mounting an integrated circuit over the die paddle;
connecting the integrated circuit and the lead extension;
connecting the integrated circuit and the paddle plating, wherein the paddle plating is a contiguous ring along the paddle peripheral side and around the integrated circuit;
forming an encapsulation over the die paddle and the lead body and covering the integrated circuit and the lead extension; and
connecting the die paddle with a tie bar at a corner of the die paddle along the paddle peripheral side, the tie bar extending outwardly in a diagonal orientation from the die paddle.

7. The method as claimed in claim 6 wherein providing the die paddle includes providing the die paddle having a paddle thickness and a projection thickness of the paddle projections, the paddle thickness greater than the projection thickness.

8. The method as claimed in claim 6 wherein forming the lead terminal includes forming the lead extension having an extension thickness and the lead body having a body thickness, the body thickness greater than the extension thickness.

9. The method as claimed in claim 6 wherein providing the die paddle includes providing the die paddle having the paddle plating along all sides of the die paddle.

10. The method as claimed in claim 6 wherein forming the lead terminal includes:
forming the lead body perpendicular to the paddle peripheral side; and
forming the lead extension at an end of the lead body facing the die paddle.

11. An integrated circuit packaging system comprising:
a die paddle having a paddle plating and paddle projections along a paddle peripheral side;
lead terminal having a lead extension with the lead extension extending towards the paddle peripheral side and between the paddle projections;
an integrated circuit mounted over die paddle and connected to the paddle plating and the lead extension, wherein the paddle plating is a contiguous ring along the paddle peripheral side and around the integrated circuit;
an encapsulation over the die paddle and covering the integrated circuit and lead extension; and
connecting the die paddle with a tie bar at a corner of the die paddle along the paddle peripheral side, the tie bar extending outwardly in a diagonal orientation from the die paddle.

12. The system as claimed in claim 11 wherein:
the die paddle includes a paddle slot along the paddle peripheral side and between the paddle projections; and
an extension tip in the paddle slot.

13. The system as claimed in claim 11 wherein the lead extension includes an extension angle, the extension angle near a center of the paddle peripheral side less than a further extension angle for a further lead extension near a corner of the paddle peripheral side.

14. The system as claimed in claim 11 wherein the lead extension has a tapered shape, the lead extension narrower at an end adjacent to the paddle peripheral side.

15. The system as claimed in claim 11 wherein the lead extension includes an extension tip adjacent to the paddle peripheral side and an extension tab at an end of the lead extension opposite the extension tip.

16. The system as claimed in claim 11 wherein:
the lead terminal includes a lead body; and
the lead extension extends from the lead body.

17. The system as claimed in claim 16 wherein:
the die paddle includes a paddle thickness; and
the paddle projections include a projection thickness, the paddle thickness greater than the projection thickness.

18. The system as claimed in claim 16 wherein:
the lead extension includes an extension thickness; and
the lead body includes a body thickness, the body thickness great than the extension thickness.

19. The system as claimed in claim 16 wherein the die paddle includes the die paddle having the paddle plating along all sides of the die paddle.

20. The system as claimed in claim 16 wherein:
the lead body is perpendicular to the paddle peripheral side; and
the lead extension is at the end of the lead body facing the die paddle.

* * * * *